US012501763B2

(12) United States Patent
Bang et al.

(10) Patent No.: US 12,501,763 B2
(45) Date of Patent: Dec. 16, 2025

(54) QUANTUM DOTS, DISPLAY APPARATUS INCLUDING THE SAME, AND METHOD FOR MANUFACTURING THE DISPLAY APPARATUS

(71) Applicants: LG DISPLAY CO., LTD., Seoul (KR); KOREA UNIVERSITY RESEARCH AND BUSINESS FOUNDATION, Seoul (KR)

(72) Inventors: Joona Bang, Paju-si (KR); Ki Seok Chang, Paju-si (KR); Jeong Min Moon, Paju-si (KR); Soon Shin Jung, Paju-si (KR); Dong Hoon Choi, Paju-si (KR); Hyung Jong Kim, Paju-si (KR); Jae Wan Ko, Paju-si (KR)

(73) Assignees: LG DISPLAY CO., LTD., Seoul (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 923 days.

(21) Appl. No.: 17/767,723

(22) PCT Filed: Sep. 22, 2020

(86) PCT No.: PCT/KR2020/012771
§ 371 (c)(1),
(2) Date: Apr. 8, 2022

(87) PCT Pub. No.: WO2021/071135
PCT Pub. Date: Apr. 15, 2021

(65) Prior Publication Data
US 2024/0114709 A1    Apr. 4, 2024

(30) Foreign Application Priority Data
Oct. 8, 2019 (KR) ........................ 10-2019-0124728

(51) Int. Cl.
*H10K 50/115* (2023.01)
*H10K 50/15* (2023.01)
(Continued)

(52) U.S. Cl.
CPC ........... *H10K 50/115* (2023.02); *H10K 50/15* (2023.02); *H10K 50/16* (2023.02); *H10K 71/231* (2023.02)

(58) Field of Classification Search
CPC ...... H10K 50/115; H10K 50/16; H10K 50/15; H10K 71/231
(Continued)

(56) References Cited

U.S. PATENT DOCUMENTS

2004/0224263 A1    11/2004    Itou et al.
2016/0367247 A1    12/2016    Weaner et al.
(Continued)

FOREIGN PATENT DOCUMENTS

CN    107708578 A    2/2018
KR    10-2004-0096761 A    11/2004
(Continued)

OTHER PUBLICATIONS

Chinese Office Action dated Jun. 15, 2023, issued in corresponding Chinese Patent Application No. 202080070746.3.
(Continued)

*Primary Examiner* — Anita Nassiri-Motlagh
(74) *Attorney, Agent, or Firm* — Morgan, Lewis & Bockius LLP

(57) ABSTRACT

The quantum dot comprises a ligand which is a copolymer comprising a first repeating unit comprising at least one or more hole transporting functional groups and a second repeating unit comprising at least one or more photocrosslinking functional groups.

15 Claims, 12 Drawing Sheets

(51) Int. Cl.
*H10K 50/16* (2023.01)
*H10K 71/20* (2023.01)

(58) Field of Classification Search
USPC .................................................... 252/301.36
See application file for complete search history.

(56) References Cited

U.S. PATENT DOCUMENTS

2018/0215695 A1    8/2018  Chen
2020/0259110 A1    8/2020  Angioni

FOREIGN PATENT DOCUMENTS

| | | |
|---|---|---|
| KR | 10-2012-0054605 A | 5/2012 |
| KR | 10-2016-0047062 A | 5/2016 |
| KR | 10-2018-0105873 A | 10/2018 |
| KR | 10-2018-0124577 A | 11/2018 |
| KR | 10-1977282 B1 | 5/2019 |
| WO | 03/086024 A1 | 10/2003 |

OTHER PUBLICATIONS

International Search Report (with partial translation) and Written Opinion issued in corresponding International Patent Application No. PCT/KR2020/012771 on Sep. 22, 2020.
First Office Action issued on Oct. 23, 2024 for counterpart Korean Patent Application No. 10-2019-0124728.

QUANTUM DOTS, DISPLAY APPARATUS INCLUDING THE SAME, AND METHOD FOR MANUFACTURING THE DISPLAY APPARATUS

CROSS REFERENCE TO RELATED APPLICATION

This application claims priority from Korean Patent Application No. 10-2019-0124728, filed on Oct. 8, 2019, which is hereby incorporated by reference for all purposes as if fully set forth herein.

BACKGROUND

Technical Field

Embodiments relate to a quantum dot, a display apparatus including the same, and a method for manufacturing the display apparatus. More specifically, embodiments may provide a quantum dot capable of forming a patterned layer by a photolithography process including a hole transporting and light crosslinking ligand, a display apparatus including the same, and a method of manufacturing the display apparatus.

Description of the Related Art

Quantum dots are being tested for applicability in fields such as solar cells, biosensors, lighting, displays, and medicine. Quantum dots are attracting attention as a next-generation display material because they can materialize display apparatuses with excellent color reproduction.

Quantum dots can be applied to the display field using a photo-luminescence phenomenon and an electro-luminescence phenomenon. Electro-luminescence refers to light emission when electrons are injected or a strong electric field is applied to a semiconductor material having an optical bandgap. The quantum dot electroluminescence display uses quantum dots as semiconductor materials. A light emitting diode using quantum dots as a semiconductor material is referred to as a quantum dot light emitting diode (QD-LED).

SUMMARY

Techniques for forming the quantum dot light emitting layer of the quantum dot light emitting diode include, for example, a transfer printing technique and an inkjet technique.

Transfer printing technology is less reliable because the solidified quantum dot light emitting layer may be destroyed in the process of physical contact. In addition, the process takes a lot of time, and there is a problem in that it is difficult to implement a high resolution.

Inkjet technology has a problem in that the density of the quantum dot light emitting layer is changed as the solvent dries, so that it is difficult to secure the light efficiency of the apparatus, the process takes a lot of time, and it is difficult to implement high resolution.

Therefore, the inventors of the present disclosure have studied on a method of forming a quantum dot light emitting layer by photolithography technology that has excellent reliability, can reduce process time, and can manufacture a high-resolution display apparatus while utilizing existing equipment. As a result, a quantum dot capable of forming a quantum dot light emitting layer by photolithography technology, a display apparatus including the same, and a method of manufacturing the display apparatus were invented.

An aspect of the present disclosure is to provide a quantum dot capable of forming a quantum dot light emitting layer by photolithography having excellent reliability, shortening a process time, and realizing a high resolution. The quantum dots include a ligand that is a copolymer including a first repeating unit and a second repeating unit. The first repeating unit includes one or more hole transporting functional groups, and the second repeating unit includes one or more photocrosslinkable functional groups.

Another aspect of the present disclosure is to provide a display apparatus that has excellent reliability, shortens process time, and can implement high resolution, including the quantum dots described above. The display apparatus includes a first electrode, a second electrode, and a light emitting layer positioned between the first electrode and the second electrode. The light emitting layer includes the quantum dots.

Another aspect of the present disclosure is to provide a method of manufacturing a display apparatus capable of forming a light emitting layer including quantum dots by a photolithography process and having excellent reliability and high resolution with a simple process. The method for manufacturing a display apparatus includes the steps of applying a solution including the quantum dots on a substrate, exposing the solution, and etching the exposed solution to form a light emitting layer containing the quantum dots.

According to an embodiment of the present disclosure, by using a quantum dot including a ligand, which is a copolymer including a first repeating unit including one or more hole transporting functional groups and a second repeating unit including one or more photocrosslinkable functional groups, the light emitting layer including the quantum dot may be formed by a photolithography process.

In addition, since the light emitting layer can be formed by a photolithography process by using the quantum dots, a display apparatus having excellent reliability, reduced process time, and excellent resolution can be provided.

In addition, according to embodiments of the present disclosure, the display apparatus including the light emitting layer including the quantum dots may form the light emitting layer by a photolithography process.

In addition, according to embodiments of the present disclosure, a method of manufacturing a display apparatus capable of manufacturing a display apparatus having excellent reliability and excellent resolution by providing a photolithography process using a solution including the quantum dots is provided.

Figure 1:
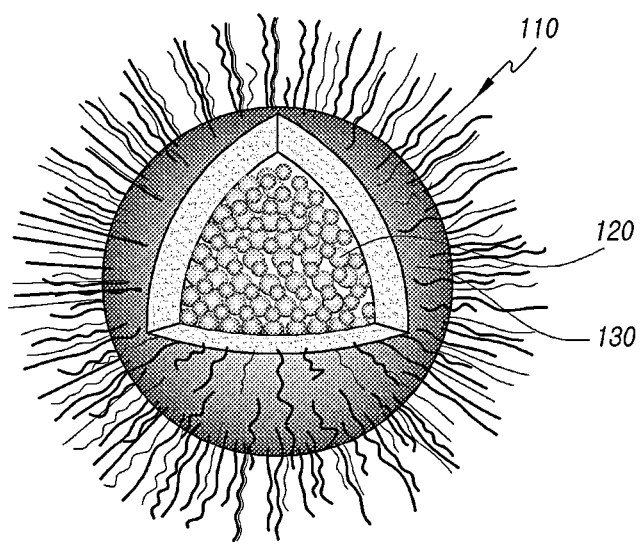
FIG. 1 illustrates a quantum dot according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Since the shape, size, ratio, angle, number, etc. disclosed in the drawings for explaining the embodiment of the present disclosure are exemplary, the present disclosure is not limited to the illustrated matters. In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present disclosure rather unclear. The terms such as "including", "having", and "comprising", used herein are generally intended to allow other components to be added unless the terms are used with the term "only". As used herein, singular forms are intended to include plural forms unless the context clearly indicates otherwise.

In interpreting the components, it is interpreted as including an error range even if there is no separate explicit description.

In the case of a description of the positional relationship, for example, when the positional relationship of the two parts is described as "on", "over", "above", "below", "beside" etc. one or more other parts may be placed between two parts unless "directly" is used.

When time relative terms, for example, "after", "subsequent to", "next", "before" and the like are used, these terms may be used to describe non-consecutive or non-sequential processes or operations unless the term "directly" or "immediately" is used together.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

FIG. 1 illustrates a quantum dot according to an embodiment of the present disclosure.

Referring to FIG. 1, a quantum dot 100 according to an embodiment of the present disclosure includes a ligand 110. In addition, the quantum dot 100 may include a core 120 and a shell 130. Although FIG. 1 shows a quantum dot having a core 120 and shell 130 structure, the quantum dots of the present disclosure are not limited to quantum dots of such a heterologous structure, and may have a single structure.

When the quantum dot 100 has a core 120 and a shell 130 structure, the core 120 is a portion that substantially emits light. The emission wavelength of the quantum dot 100 is determined according to the size of the core 120. For the quantum confine effect, the core 120 should have a size smaller than the exciton Bohr radius according to each material, and have an optical band gap in the corresponding size.

The quantum dots 100 may be semiconductor nanocrystals or metal oxide particles having a quantum confinement effect. For example, the quantum dot 100 may include a nano-semiconductor compound of group II-VI, group I-III-VI, or group III-V. More specifically, the core 120 and/or the shell 130 constituting the quantum dot 100 can include group II to group VI compound semiconductor nanocrystals such as CdS, CdSe, CdTe, ZnS, ZnSe, ZnTe, HgS, HgTe, and/or a combination thereof; group III to group V or group IV to group VI compound semiconductor nanocrystals such as GaP, GaAs, GaSb, InP, InAs and/or InSb; PbS, PbSe, PbTe and/or any combination thereof; $AgGaS_2$, $AgGaSe_2$, $AgGaTe_2$, $CuInS_2$, $CuInSe_2$, $CuGaS_2$, $CuGaSe_2$ nanocrystals; metal oxide nanoparticles such as ZnO, $TiO_2$ and/or combinations thereof; nanocrystal having core-shell structure such as CdSe/ZnSe, CdSe/ZnS, CdS/ZnSe, CdS/ZnS, ZnSe/ZnS, InP/ZnSZnO/MgO and/or any combination thereof. The semiconductor nanoparticles are doped or undoped with rare earth elements such as Eu, Er, Tb, Tm, Dy or any combination thereof, or are doped or undoped with transition metal elements such as Mn, Cu, Ag, Al, or any combination thereof. For example, the core 120 constituting the quantum dot 100 may include one of ZnSe, ZnTe, CdSe, CdTe, InP, ZnCdS, CuxIn1-xS, CuxIn1-xSe, AgxIn1-xS, or combinations thereof.

In addition, the shell 130 constituting the quantum dot 100 may include one of ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $CdXZn_{1-x}S$, or combinations thereof. Optionally, the quantum dots 100 may include alloy quantum dots (alloy QDs; for example, $CdSxSe_{1-x}$, $CdSexTe_{1-x}$, $ZnxCd_{1-x}Se$) such as homogeneous alloy quantum dots or gradient alloy quantum dots.

The quantum dot 100 may be mainly synthesized by a wet process for growing precursor materials and particles in organic solvents, such as colloidal quantum dots or hot injection method in which a low-temperature precursor solution is injected into a high-temperature precursor solution including oleic acid as initial ligand.

When the quantum dots are formed by a wet process or a hot injection method, for example, an initial ligand such as oleic acid, etc., may be bound to the surface of the shell. The ligand 110 according to an embodiment of the present disclosure is configured to modify the surface of the quantum dot 100 formed by, for example, a wet process or a hot injection method.

The ligand 110 may be, for example, bound to the outer surface of the shell 120 of the quantum dot 100 and included in the quantum dot 100. The ligand 110 may improve the dispersibility of the quantum dots 100 in solution.

Figure 2:
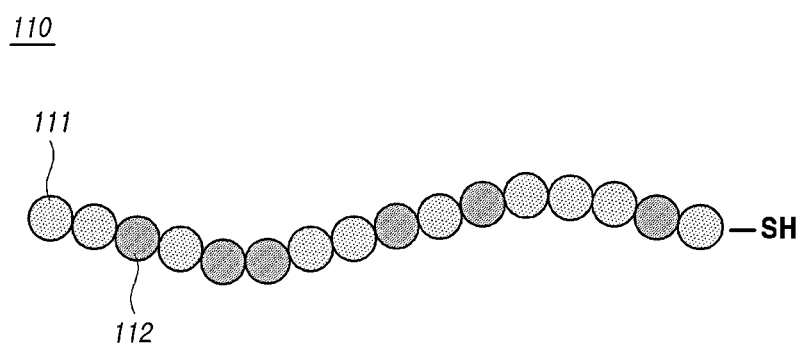
FIG. 2 illustrates a ligand according to an embodiment of the present disclosure.

FIG. 2 illustrates the ligand according to an embodiment of the present disclosure.

Referring to FIG. 2, the ligand 110 is a copolymer including a first repeating unit 111 and a second repeating unit 112. The first repeating unit 111 includes one or more hole transporting functional groups, and the second repeating unit 112 includes one or more photocrosslinkable functional groups.

The first repeating unit 111 and the second repeating unit 112 refer to a structure in which a compound having a certain structure is connected by a covalent bond to repeat it, and the number of repetitions is not particularly limited. For example, when the first repeating unit 111 is m times repeatedly included in the ligand 110, it may be expressed as $-(A)_m-$, and A may be referred to the first repeating unit.

For example, the first repeating unit 111 is a repeating unit of the first monomer in which the first monomer A is repeated m times (provided that m is an integer greater than or equal to 1), and the second repeating unit 112 is a repeating unit of the second monomer in which the second monomer is repeated n times (provided that, n is an integer greater than or equal to 1). Since the first repeating unit 111 includes a hole transporting functional group, hole transporting properties may be imparted to the ligand 110. Since the second repeating unit 112 includes a photocrosslinkable functional group, photocrosslinkability may be imparted to the ligand 110. Therefore, since the ligand 110 has hole transport properties and light crosslinking properties, the light emitting efficiency of the quantum dot light emitting diode including the quantum dot 100 can be improved, and the light emitting layer of the quantum dot light emitting diode can be formed by a photolithography process.

The hole transporting functional group of the first repeating unit is not particularly limited as long as it is a functional group capable of imparting hole transporting properties to the ligand 110. For example, the hole transporting functional group of the first repeating unit may include at least one or more of an indolyl group, a carbazolyl group, a benzofuranyl group, a dibenzofuranyl group, a benzothiophenyl group, a dibenzothiophenyl group, or an amino group.

The first repeating unit may have a structure in which the first monomer is polymerized. The first monomer may be, for example, one of N-vinylcarbazole, triphenylamine, 4-butylphenyldiphenylamine, tris(4-carbazol-9-ylphenyl)amine, or N'-dicarbazolyl-3,5-benzene.

The photocrosslinkable functional group of the second repeating unit is not particularly limited as long as it includes a functional group that allows the ligand 110, which is a copolymer, to be crosslinked by irradiation with energy rays. For example, the photocrosslinkable functional group of the second repeating unit may be one of an azide group, diazirine, benzoylphenoxy group, an alkenyloxycarbonyl group, (meth)acryloyl group, or an alkenyloxyalkyl group.

The second repeating unit may have a structure formed by polymerizing a second monomer including an arbitrary functional group and then substituting the arbitrary functional group with a photocrosslinkable functional group. The arbitrary functional group may include, for example, a halogen group.

The copolymer as a ligand may have a number average molecular weight (Mn) of 100 to 50,000. The lower limit of the number average molecular weight of the copolymer as the ligand may be, for example, 200 or more, 400 or more, or 800 or more. The upper limit of the number average molecular weight of the copolymer as the ligand may be, for example, 25,000 or less, 13,000 or less, or 7,000 or less.

The copolymer as a ligand may have a weight average molecular weight (Mw) of 100 to 50,000. The lower limit of the weight average molecular weight of the copolymer as the ligand may be, for example, 200 or more, 400 or more, or 800 or more. The upper limit of the weight average molecular weight of the copolymer as the ligand may be, for example, 25,000 or less, 13,000 or less, or 7,000 or less.

The molecular weight distribution (PDI) of the copolymer as the ligand may be 1 to 2. The lower limit of the molecular weight distribution of the copolymer may be, for example, 1.1 or more, 1.2 or more, or 1.3 or more. The upper limit of the molecular weight distribution of the copolymer may be, for example, 1.9 or less, 1.8 or less, or 1.7 or less.

A number average molecular weight (Mn), a weight average molecular weight (Mw), and a molecular weight distribution (PDI) may be measured by gel permeation chromatography (GPC). When the number average molecular weight (Mn), the weight average molecular weight (Mw), and the molecular weight distribution (PDI) of the ligand copolymer satisfy the ranges, it is possible to ensure excellent hole transport properties and process capability while improving the dispersibility of quantum dots.

The ligand copolymer may include 90 mol % to 99.9 mol % of the first repeating unit 111. The ratio may be a ratio of the number of moles of the first repeating unit to the number of moles of all repeating units included in the copolymer. For example, when the ligand copolymer is expressed as $-(A)_m-(B)_n-$, wherein A is the first repeating unit, the ratio of the first repeating unit can be calculated as $m/(m+n)\times100$. The lower limit of the ratio of the first repeating unit 111 may be, for example, 92 mol % or more, 94 mol % or more, or 95 mol % or more. The upper limit of the ratio of the first repeating unit 111 may be, for example, 99.8 mol % or less, 99.5 mol % or less, or 99 mol % or less.

The ligand copolymer may include the second repeating unit 112 in an amount of 0.1 mol % to 10 mol %. The ratio may be a ratio of the number of moles of the second repeating unit to the number of moles of all repeating units included in the copolymer. For example, when the ligand copolymer is expressed as -(A)$_m$-(B)$_n$-, and B is the second repeating unit, the ratio of the second repeating unit can be calculated as n/(m+n)×100. The lower limit of the ratio of the second repeating unit 112 may be, for example, 0.2 mol % or more, 0.5 mol % or more, or 1 mol % or more. The upper limit of the ratio of the second repeating unit 112 may be, for example, 8 mol % or less, 6 mol % or less, or 5 mol % or less.

When the ratio of the first repeating unit 111 and the second repeating unit 112 included in the copolymer satisfies the range, the copolymer may have hole transport properties to improve the luminous efficiency of a quantum dot light emitting diode including quantum dots and have photocrosslinking properties that enable photolithography process.

The ligand 110, which is a copolymer, may be a random copolymer. Accordingly, the first repeating unit 111 and the second repeating unit 112 may be repeated in an arbitrary order to constitute the ligand 110.

The ligand copolymer may be represented by the following chemical formula 1.

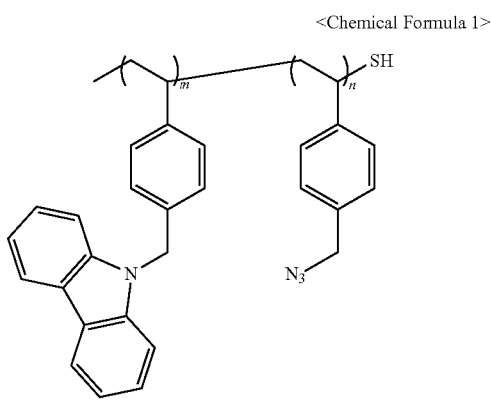

<Chemical Formula 1>

In Chemical Formula 1, m and n are each independently an integer of 1 to 200. Values of m and n are determined so that the ligand copolymer can satisfy the number average molecular weight, the weight average molecular weight, the molecular weight distribution, and molar ratio of the first repeating unit and the second repeating unit.

When the ligand copolymer is represented by Chemical Formula 1, a quantum dot light emitting apparatus having excellent light emitting efficiency while the quantum dot light emitting layer can be formed by a photolithography process can be provided.

Figure 3:
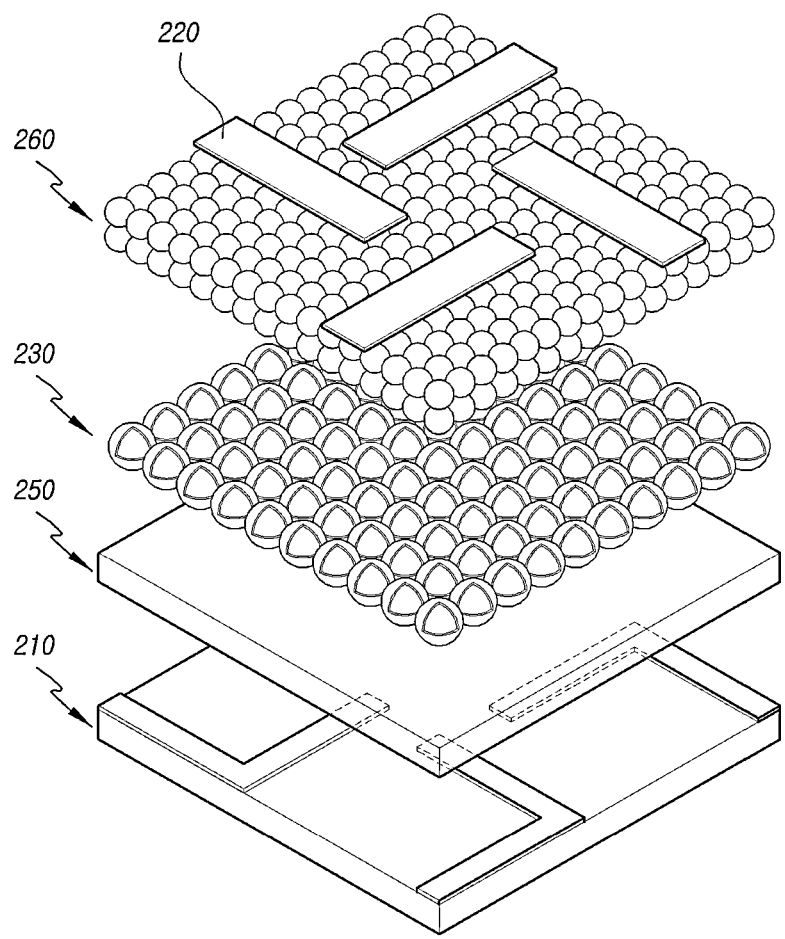
FIGS. 3 to 5 illustrates a display apparatus according to an embodiment of the present disclosure.

FIG. 3 illustrates a display apparatus according to an embodiment of the present disclosure.

In describing the present embodiment, descriptions of the same or corresponding components as in the previous embodiment will be omitted. Hereinafter, a display apparatus according to an embodiment of the present disclosure will be described.

Referring to FIG. 3, a display apparatus 200 according to an embodiment of the present disclosure includes a first electrode 210, a second electrode 220, and a light emitting layer 230 between the first electrode 210 and the second electrode 220.

The first electrode 210, the second electrode 220, and the light emitting layer 230 between the first electrode 210 and the second electrode 220 may be referred to as a quantum dot light emitting apparatus. Also, the display apparatus 200 may include a display panel in which a plurality of sub-pixels are arranged and a driving circuit configured to drive the display panel. The sub-pixel may include the quantum dot light emitting apparatus and circuit elements such as a driving transistor configured to drive the quantum dot light emitting apparatus.

The first electrode 210 may be positioned on the substrate 240 (not illustrated). The first electrode 210 may be, for example, an anode that supplies holes to the emitting layer 230. The type of the first electrode 210 is not particularly limited as long as it can supply holes to the emitting layer 230, and may include, for example, indium tin oxide (ITO).

The type of the substrate 240 is not particularly limited as long as the first electrode 210 can be formed on the substrate 240, and a glass substrate or a plastic substrate may be used. In particular, when flexibility is required for a display apparatus, a plastic substrate may be used.

The second electrode 220 is disposed on at least one surface the first electrode 210. The second electrode 220 may be, for example, a cathode that supplies electrons to the emitting layer 230. The type of the second electrode 220 is not particularly limited as long as it can supply electrons to the emitting layer 230, and may include, for example, aluminum.

a hole transport layer 250 may be disposed between the first electrode 210 and the emitting layer 230. For example, the hole transport layer 250 may transfer holes supplied from the first electrode 210, which is an anode electrode, to the light emitting layer 230.

The material constituting the hole transport layer 250 may be selected in consideration of the characteristics of other layers such as the light emitting layer 230, and is not particularly limited. For example, the hole transport layer 250 may include poly(3,4-ethylenedioxythiophene) polystyrene sulfonate (PEDOT:PSS).

An electron transport layer 260 may be positioned between the second electrode 220 and the light emitting layer 230. For example, the electron transport layer 260 may transfer electrons supplied from the second electrode 220, which is a cathode electrode, to the light emitting layer 230.

The material constituting the electron transport layer 260 may be selected in consideration of the characteristics of other layers, such as the light emitting layer 230, and is not particularly limited. For example, the electron transport layer 260 may include metal oxide nanoparticles, in detail, zinc oxide nanoparticles (ZnO NPs).

The light emitting layer 230 includes the quantum dots of the present embodiment. Accordingly, since the light emitting layer 230 may be formed by a photolithography process, the display apparatus according to the embodiment of the present disclosure may have high reliability, a simple process, and high resolution.

Figure 4:
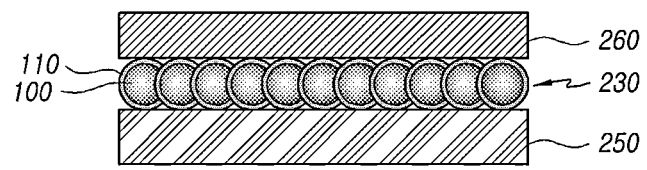

FIG. 4 illustrates a display apparatus according to an embodiment of the present disclosure.

Referring to FIG. 4, the light emitting layer 230 and the hole transport layer 250 may be in direct contact with each other. The light emitting layer 230 includes the quantum dots 100, and since the ligand 110 is disposed on the surface of the quantum dot 100, the ligand 110 of the quantum dot 100 is in contact with the hole transport layer 250 to form an interface. In this example, the display apparatus may include an interface between the ligand 110 of the quantum dot 100 and the hole transport layer 250.

The light emitting layer 230 and the electron transport layer 260 may be in direct contact with each other. The light emitting layer 230 includes the quantum dots 100, and since the ligand 110 is disposed on the surface of the quantum dot 100, the ligand 110 of the quantum dot 100 contacts the electron transport layer 260 to form an interface. In this example, the display apparatus may include an interface between the ligand 110 of the quantum dot 100 and the electron transport layer 260.

Since the ligand 110 includes the first repeating unit 111 including a hole transport functional group, the exciton quenching phenomenon occurring in the light emitting layer 230 by forming an interface with the electron transport layer 260 can be suppressed. For example, a fast quenching channel is formed by hole leakage through the oxygen vacancy of the zinc oxide nanoparticles included in the electron transport layer 260, so that the exciton quenching phenomenon may occur. However, when the ligand 110 forms an interface with the electron transport layer 260, the ligand copolymer serves as an insertion layer between the electron transport layer 260 and the light emitting layer 230, thereby suppressing the exciton quenching phenomenon at oxygen vacancy of zinc oxide nanoparticles.

Figure 5:
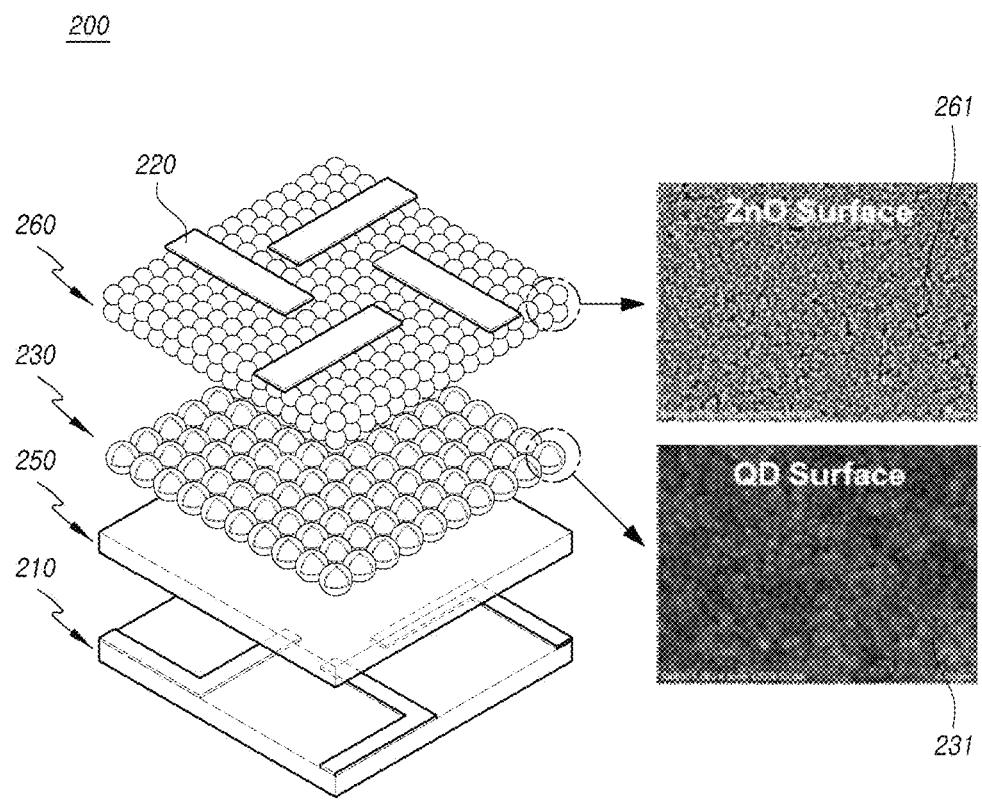

FIG. 5 illustrates a display apparatus according to an embodiment of the present disclosure.

Referring to FIG. 5, the emitting layer 230 may include a first pattern 231. The first pattern may be a surface shape of the light emitting layer that appears as the quantum dots 100 included in the light emitting layer 230 are closely packed. The specific shape of the first pattern is not particularly limited, and, for example, may be adjusted by the type of the core and shell of the quantum dot 100 and the particle size of the quantum dot.

The electron transport layer 260 may include a second pattern 261. The second pattern may be implemented by forming the electron transport layer 260 having a thin thickness on the light emitting layer 230 in which the first pattern is implemented along the surface of the light emitting layer 230. The thickness of the electron transport layer 260 may be, for example, 10 nm to 100 nm.

Figure 6:
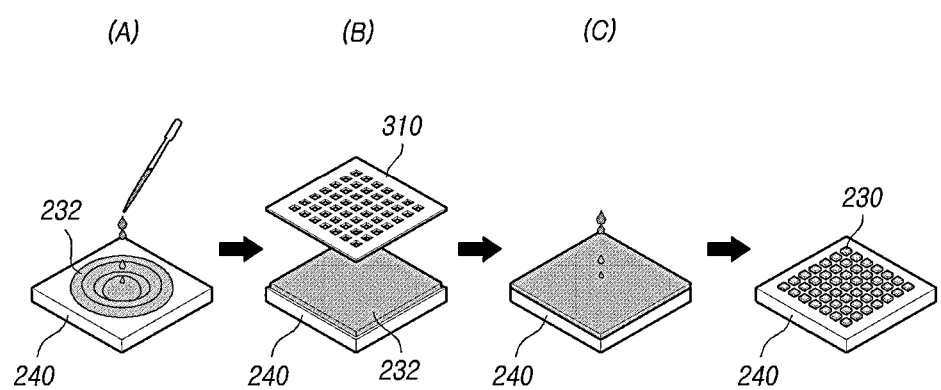
FIG. 6 illustrates a method of manufacturing a display apparatus according to an embodiment of the present disclosure.

FIG. 6 illustrates a method of manufacturing a display apparatus according to an embodiment of the present disclosure.

In describing the present disclosure, descriptions of the same or corresponding components as in the previous embodiment will be omitted. Hereinafter, a display apparatus according to an embodiment of the present disclosure will be described with reference to this.

Referring to FIG. 6, the method of manufacturing a display apparatus according to an embodiment of the present disclosure includes a step (A) of applying the solution 232 including the quantum dots 100 on a substrate 240, a step (B) of exposing the solution 232 applied on the substrate 240 to light, and a step (C) of etching the exposed solution to form the light emitting layer 230 including the quantum dots 100 described above.

The step of applying the solution including the quantum dots 100 on the substrate 240 is performed to form the light emitting layer 230 on the substrate 240. The step of applying the solution including the quantum dots 100 on the substrate 240 may be used by a related art method, for example, spin coating, spray coating, dip coating, slit die coating, and bar coating may be used.

The solution may include quantum dots 100 and a solvent. The solvent may be selected in consideration of the degree of dispersion and volatility of the quantum dots 100, for example, chlorobenzene may be used, but the solvent is not limited thereto.

On the substrate 240, for example, the above-described first electrode 210 may be positioned. In addition, the above-described hole transport layer 250 may be disposed on the first electrode 210. Accordingly, although the solution containing the quantum dots 100 is applied on the substrate 240, it may not be directly applied to one surface of the substrate 240.

The step of exposing the solution 232 applied on the substrate 240 is a step for allowing crosslinking between the ligands 120 to proceed by the photocrosslinking functional group of the ligand 120 included in the quantum dot 100. For example, when UV light is irradiated to the solution 232 applied on the substrate, crosslinking between the ligands 120 in the UV-irradiated portion proceeds and only the UV-irradiated portion remains by the etching process and a portion that is not irradiated with ultraviolet light may be removed.

The step of exposing the solution 232 applied on the substrate 240 may be used by the photomask 310. When the photomask 310 is used, only a portion of the solution 232 applied on the substrate 240 can be exposed quickly.

The step of etching the exposed solution to form the light emitting layer 230 including the quantum dots described above may, for example, remove an unexposed portion. As described above, since the ligand contains a photocrosslinkable functional group, crosslinking between the ligands may proceed by exposure. On the other hand, since crosslinking does not proceed in the unexposed portion, for example, the exposed portion and the unexposed portion may have different reactivity with respect to a solvent used for etching. Accordingly, when etching is performed, the light emitting layer 230 in which the pattern is implemented is formed.

A method of etching the exposed solution 232 is not particularly limited, but may be, for example, wet etching using a solvent.

The method of manufacturing a display apparatus may include forming an electron transport layer. The electron transport layer may be formed on the light emitting layer formed by etching. For example, the electron transport layer may be formed on the light emitting layer so as to be in contact with the surface of the light emitting layer. When the electron transport layer is formed to contact the surface of the light emitting layer, as described above, the quantum dot ligand included in the light emitting layer forms an interface with the electron transport layer and serves as an insertion layer (or intermediate layer), thereby improving the efficiency of the quantum dot light emitting apparatus.

Hereinafter, embodiments of the present disclosure will be described through Synthesis Examples of ligands and quantum dot light emitting apparatuses, but embodiments of the present disclosure are not limited to the following specific examples.

Synthesis Example 1: Synthesis of Hole Transporting and Photocrosslinking Ligand Copolymer 1) Synthesis of the First Hole-Transporting Monomer Carbazole and sodium hydroxide were added to 4-vinylbenzyl chloride to be synthesized 9-[(4-ethenylphenyl)methyl]carbazole as a first monomer as follows.

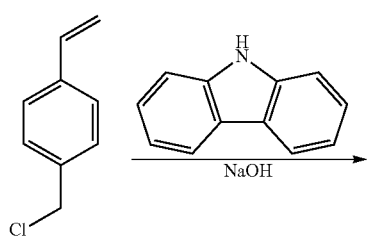

2) Polymerization of the First Monomer and the Second Monomer

The first monomer 9-[(4-ethenylphenyl)methyl]carbazole and the second monomer 4-vinylbenzyl chloride were subjected to a living free radical polymerization method of reversible addition-fragmentation chain transfer (RAFT) polymerization as follows.

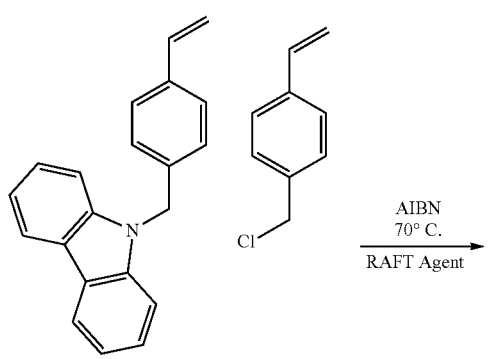

During RAFT polymerization, 4-vinylbenzyl chloride as the second monomer was added in a ratio of 5 mol % based on the number of moles of the total monomers.

3) Introduction of a Photocrosslinkable Functional Group by a Substitution Reaction and Introduction of a Thiol Group for the Formation of a Metal Complex A polymer ligand was prepared using hexylamine and NaN₃ after the RAFT polymerization.

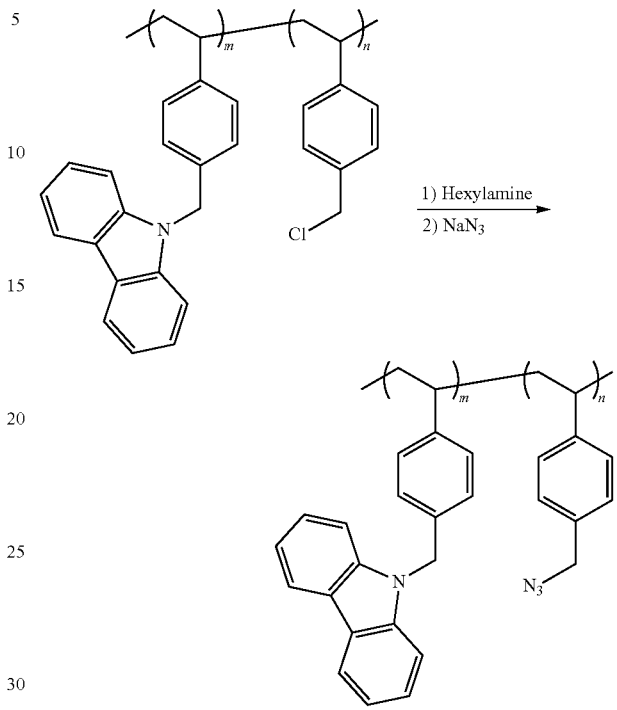

As a result of GPC measurement, the prepared ligand had a molecular weight distribution (PDI) of about 1.2 to about 1.3, and a weight average molecular weight (Mw) of about 5,000 to about 10,000.

Synthesis Example 2: Ligand Substitution of Colloidal Quantum Dots Using the Ligand Prepared in Synthesis Example 1

The ligand of the CdSe quantum dot, which is a colloidal quantum dot including oleic acid (OA) as a ligand, was substituted with the copolymer synthesized in the above Synthesis Example. The following experiments were performed before and after ligand substitution to compare the optical properties of quantum dots.

Figure 7:
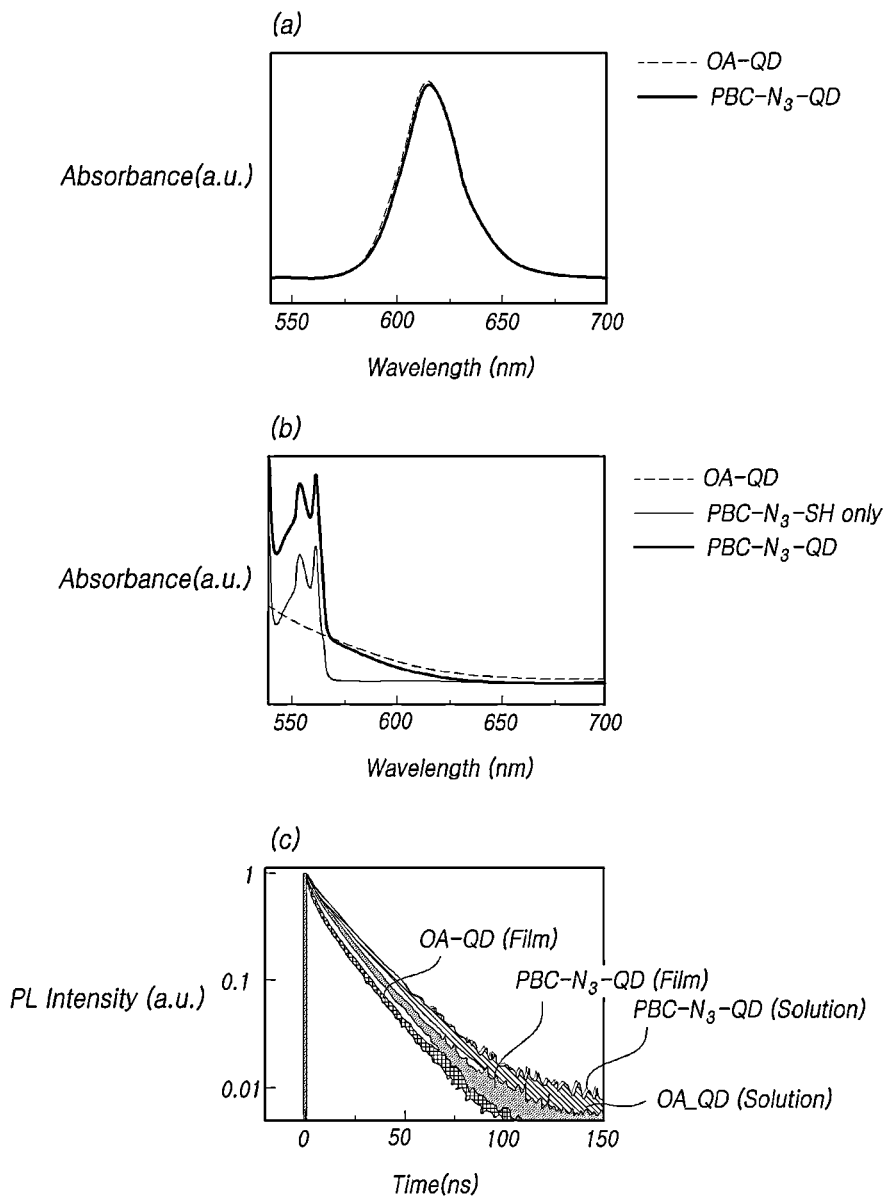
FIG. 7 is a data obtained by measuring whether optical properties change when a copolymer ligand according to an embodiment of the present disclosure is substituted for quantum dots.

Experimental Example: Changes in Optical Properties of Quantum Dots by Ligand Substitution FIG. 7 is data obtained by measuring whether optical properties change when a copolymer ligand according to an embodiment of the present disclosure is substituted for quantum dots.

FIG. 7(a) illustrates the quantum dots (OA-QD) including the oleic acid ligand and the quantum dots (PBC-N₃-QD) including the hole-transporting and light-crosslinking copolymer ligands prepared in Synthesis Example. The intensity of photoluminescence (PL) was measured. Referring to FIG. 7(a), it can be seen that the photoluminescence properties of quantum dots are maintained even when the oleic acid ligand is substituted with the ligand copolymer according to the embodiment of the present disclosure.

FIG. 7(b) measures the absorbance according to the irradiated light of i) a quantum dot (OA-QD) including an oleic acid ligand, ii) a hole transporting and photocrosslinkable copolymer ligand prepared in Synthesis Example, and iii) the quantum dots (PBC-N₃-QD) including the hole-transporting and photocrosslinkable copolymer ligand prepared in Synthesis.

Referring to FIG. 7(b), it can be seen that the copolymer ligand (PBC-N₃-only) according to the embodiment of the present disclosure has absorbance for light in the ultraviolet region. In the case of a quantum dot (PBC-N₃-QD) including a copolymer ligand according to an embodiment of the present disclosure, it can be seen that the optical properties of the quantum dot (OA-QD) are maintained in the visible region while exhibiting absorbance due to the copolymer ligand (PBC-N₃-only) in the ultraviolet region. Therefore, when the copolymer ligand according to an embodiment of the present disclosure is substituted for quantum dots, crosslinking of the ligand can be generated by irradiation with energy rays in the ultraviolet region, and light emission in a specific wavelength region is possible due to the quantum confinement effect.

FIG. 7(c) measures the exciton lifetime of i) a quantum dot (OA-QD) solution including an oleic acid ligand, ii) a quantum dot (OA-QD) film including an oleic acid ligand, iii) the quantum dot (PBC-N3-QD) solution containing the ligand copolymer according to an embodiments of the present disclosure and iv) the quantum dot (PBC-N3-QD) film containing the ligand copolymer according to an embodiment of the present disclosure.

Referring to FIG. 7(c), it can be seen that even if the oleic acid ligand is substituted with the ligand copolymer according to an embodiment of the present disclosure, the optical properties of the quantum dots do not change significantly.

Figure 8:
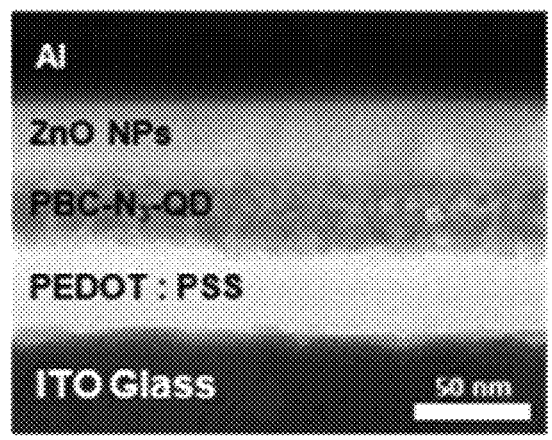
FIG. 8 is a transmission electron microscope photograph of the quantum dot light emitting apparatus manufactured according to an embodiment of the present disclosure.

Preparation Example: Preparation of a Quantum Dot Light Emitting Apparatus Comprising a Hole Transporting Property and a Light Crosslinking Ligand A quantum dot light emitting apparatus including the quantum dots prepared in Synthesis Example was manufactured. ITO (anode, 50 nm) was treated with UV-ozone for 1 hour. After spin-coating PEDOT:PSS on ITO at 4000 rpm, it was dried at 120° C. for 30 minutes to form a 40 nm hole transport layer. A solution for forming a quantum dot light emitting layer was prepared by dispersing the quantum dots prepared in the above synthesis example in a chlorobenzene solvent. The solution for forming the quantum dot light emitting layer was spin-coated on the hole transport layer at 2000 rpm, and then the ligand copolymer was partially cured by irradiating a UV lamp using a TEM grid as a photomask. Thereafter, wet etching was performed to pattern the quantum dot emission layer of about 40 nm. An electron transport layer containing zinc oxide was formed on the quantum dot light emitting layer to a thickness of about 40 nm. A quantum dot light emitting apparatus was manufactured by forming a thin aluminum film to a thickness of 100 nm on the electron transport layer to form a cathode. A transmission electron microscope (TEM) photograph of a cross section of the manufactured quantum dot light emitting apparatus is shown in FIG. 8. Referring to FIG. 8, it can be seen that the quantum dot emission layer (PBC-N₃-QD) is in direct contact with the hole transport layer (PEDOT:PSS) and the electron transport layer (ZnO NPs).

In addition, the first pattern and the second pattern attached to the above-mentioned FIG. 5 are images taken with a scanning electron microscope (SEM) of the surfaces of the light emitting layer and the electron transport layer of the quantum dot light emitting apparatus prepared in this preparation example. Referring to FIG. 5, it can be seen that, in the light emitting layer of Preparation Example, a pattern is implemented on the surface due to quantum dots, and the electron transport layer formed on the quantum dot light emitting layer also has a second pattern.

Figure 9:
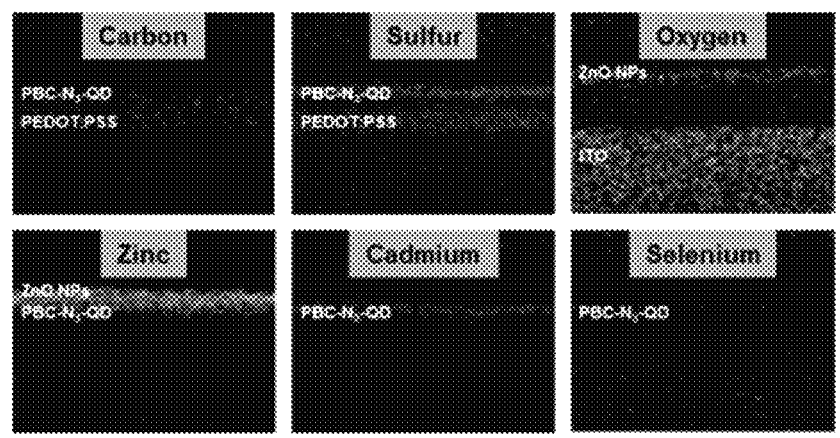
FIG. 9 shows data mapping the quantum dot light emitting apparatus manufactured according to an embodiment of the present disclosure using Energy Dispersive X-ray Spectroscopy (EDS).

FIG. 9 shows data mapping the quantum dot light emitting apparatus manufactured in Preparation Example using Energy Dispersive X-ray Spectroscopy (EDS). FIG. 9 shows that the quantum dot light emitting device includes the layers shown in FIG. 8.

Figure 10:
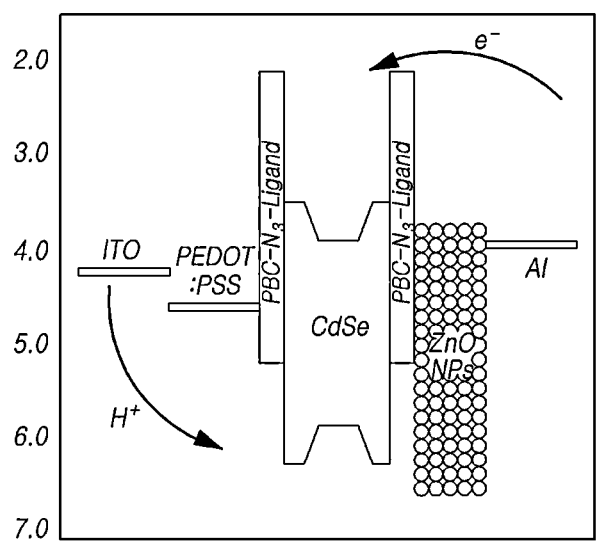
FIG. 10 illustrates the apparatus characteristics of the quantum dot light emitting apparatus manufactured according to an embodiment of the present disclosure.

FIG. 10 is a diagram for explaining that the quantum dot light emitting apparatus manufactured in Preparation Example exhibits excellent luminous efficiency.

The quantum dot light emitting apparatus according to the embodiment of the present disclosure may include an interface in which the ligand of the quantum dot and the hole transport layer are in contact. Referring to FIG. 10, the ligand (PBC-N₃-ligand) on the surface of the quantum dot (CdSe QD) lowers the energy barrier between the hole transport layer (PEDOT:PSS) and the quantum dot (CdSe QD) so that holes are smoothly transferred.

Comparative Example: Preparation of Quantum Dot Light Emitting Apparatus

Figure 11:
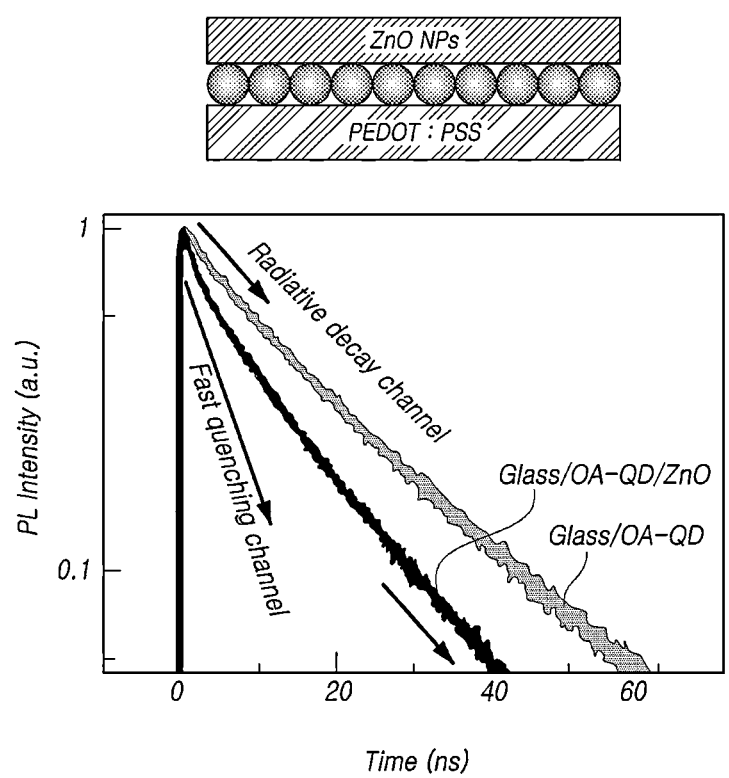
FIG. 11 is data obtained by measuring photoluminescence dynamics of the quantum dot light emitting apparatus manufactured in Comparative Example.
Figure 12:
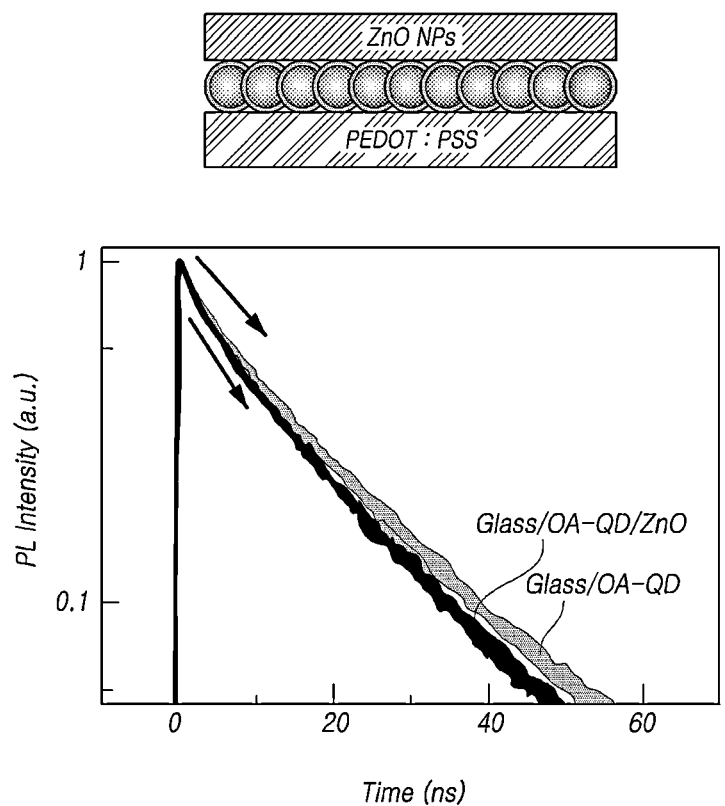
FIG. 12 is data obtained by measuring photoluminescence dynamics of the quantum dot light emitting apparatus manufactured according to an embodiment of the present disclosure.

A quantum dot light emitting apparatus was manufactured in the same manner as in Example, except that a quantum dot containing oleic acid was used instead of the quantum dot containing the hole transporting and light crosslinking copolymer ligand according to an embodiment of the present disclosure, and the light emitting layer was formed by an inkjet process in the step of forming the light emitting layer, FIGS. 11 and 12 are analysis of photoluminescence dynamics of quantum dot light emitting apparatuses manufactured in Comparative Example and Example, respectively. Referring to FIGS. 11 and 12, it can be seen that when the comparative example not including the copolymer ligand according to an embodiment of the present disclosure is used, the characteristics of the light emitting apparatus are deteriorated due to the exciton quenching phenomenon at the interface between the electron transport layer and the light emitting layer. On the other hand, in the case of the present embodiment, it can be seen that the copolymer ligand according to an embodiment of the present disclosure serves as an insertion layer between the electron transport layer and the light emitting layer to suppress the exciton quenching phenomenon.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A quantum dot, comprising:
   a ligand which is a copolymer comprising a first repeating unit comprising at least one or more hole transporting functional groups; and a second repeating unit comprising at least one or more photocrosslinkable functional groups,
   wherein the copolymer has a number average molecular weight of 100 to 50,000.

2. The quantum dot of claim 1, wherein the at least one or more hole transporting functional groups of the first repeating unit comprise at least one or more among an indolyl group, a carbazolyl group, a benzofuranyl group, a dibenzofuranyl group, a benzothiophenyl group, a dibenzothiophenyl group, or an amino group.

3. The quantum dot of claim 1, wherein the first repeating unit has a structure in which a first monomer is polymerized, and the first monomer comprises at least one of N-vinylcarbazole, triphenylamine, 4-butylphenyldiphenylamine, tris(4-carbazol-9-ylphenyl)amine, or N'-dicarbazolyl-3,5-benzene.

4. The quantum dot according to claim 1, wherein the at least one or more photocrosslinkable functional groups of the second repeating unit comprises at least one of an azide group, a diazirine group, a benzoylphenoxy group, an alkenyloxycarbonyl group, a (meth)acryloyl group, or an alkenyloxyalkyl group.

5. The quantum dot of claim 1, wherein the copolymer has a weight average molecular weight of 100 to 50,000.

6. The quantum dot of claim 1, wherein the copolymer has a molecular weight distribution of 1 to 2.

7. The quantum dot of claim 1, wherein the copolymer comprises the second repeating unit in an amount of 0.1 mol % to 10 mol %.

8. The quantum dot of claim 1, wherein the copolymer comprises a random copolymer.

9. The quantum dot of claim 1, wherein the copolymer is represented by the following Chemical Formula 1:

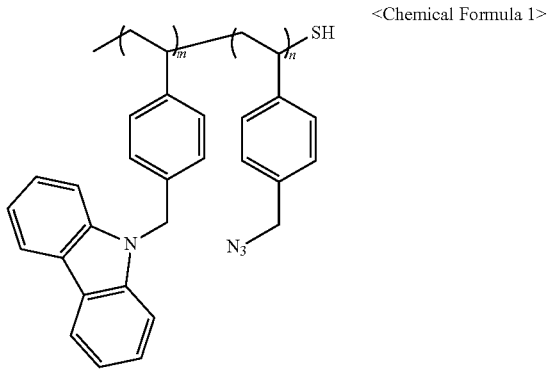

<Chemical Formula 1> wherein, in the Chemical Formula 1, m and n are each an integer of 1 to 200.

10. A display apparatus, comprising:

a first electrode;

a second electrode; and a light emitting layer disposed between the first electrode and the second electrode and including the quantum dot of claim 1.

11. The display apparatus of claim 10, further comprising:

a hole transport layer between the first electrode and the light emitting layer; and an electron transport layer between the second electrode and the light emitting layer.

12. The display apparatus of claim 11, further comprising an interface in which the ligand of the quantum dot and the electron transport layer are in contact.

13. The display apparatus of claim 11, further comprising an interface in which the ligand of the quantum dot and the hole transport layer are in contact.

14. A method of manufacturing a display apparatus, comprising:

applying a solution including the quantum dots of claim 1 on a substrate;

exposing the solution applied on the substrate; and apparatus etching the exposed solution to form a light emitting layer including the quantum dots.

15. The method of manufacturing a display apparatus of claim 14, further comprising forming an electron transport layer on the light emitting layer.

* * * * *